United States Patent
Lee et al.

(10) Patent No.: US 11,502,248 B2
(45) Date of Patent: Nov. 15, 2022

(54) FERROELECTRIC COMPONENTS AND CROSS POINT ARRAY DEVICES INCLUDING THE FERROELECTRIC COMPONENTS

(71) Applicant: SK hynix Inc., Icheon-si (KR)

(72) Inventors: Jae Gil Lee, Seoul (KR); Hyangkeun Yoo, Seongnam-si (KR); Jae Hyun Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 116 days.

(21) Appl. No.: 17/028,813

(22) Filed: Sep. 22, 2020

(65) Prior Publication Data

US 2021/0336132 A1    Oct. 28, 2021

(30) Foreign Application Priority Data

Apr. 27, 2020    (KR) ................. 10-2020-0051075

(51) Int. Cl.
| | |
|---|---|
| *H01L 31/00* | (2006.01) |
| *H01L 21/00* | (2006.01) |
| *H01L 45/00* | (2006.01) |
| *H01L 27/24* | (2006.01) |
| *H01L 27/11502* | (2017.01) |

(52) U.S. Cl.
CPC ........ *H01L 45/08* (2013.01); *H01L 27/11502* (2013.01); *H01L 27/2463* (2013.01)

(58) Field of Classification Search
CPC .......... H01L 27/11502; H01L 27/2463; G11C 2213/56
USPC ............. 438/3, 135, 142, 602–604; 257/745, 257/613–615
See application file for complete search history.

(56) References Cited

U.S. PATENT DOCUMENTS

| | | | | |
|---|---|---|---|---|
| 9,461,245 | B1* | 10/2016 | Yang ................... | H01L 45/1253 |
| 9,735,355 | B2* | 8/2017 | Williams ............... | H01L 45/08 |
| 10,756,263 | B2* | 8/2020 | Appenzeller ...... | G11C 13/0069 |
| 10,910,560 | B2* | 2/2021 | Trinh .................. | H01L 27/2436 |
| 10,950,784 | B2* | 3/2021 | Chang ................ | H01L 45/1641 |
| 2018/0269216 | A1 | 9/2018 | Lee | |
| 2019/0115353 | A1 | 4/2019 | O'Brien et al. | |
| 2021/0135105 | A1* | 5/2021 | Chen ...................... | H01L 45/08 |
| 2021/0336134 | A1* | 10/2021 | Pesic ..................... | G06N 3/061 |

* cited by examiner

*Primary Examiner* — Calvin Lee
(74) *Attorney, Agent, or Firm* — William Park & Associates Ltd.

(57) ABSTRACT

A ferroelectric component includes a first electrode, a tunnel barrier layer disposed on the first electrode to include a ferroelectric material, a tunneling control layer disposed on the tunnel barrier layer to control a tunneling width of electric charges passing through the tunnel barrier layer, and a second electrode disposed on the tunneling control layer.

18 Claims, 12 Drawing Sheets

FERROELECTRIC COMPONENTS AND CROSS POINT ARRAY DEVICES INCLUDING THE FERROELECTRIC COMPONENTS

CROSS-REFERENCE TO RELATED APPLICATIONS

The present application claims priority under 35 U.S.C. 119(a) to Korean Application No. 10-2020-0051075, filed on Apr. 27, 2020, which is herein incorporated by references in its entirety.

BACKGROUND

1. Technical Field

The present disclosure relates to ferroelectric components and cross array point arrays including the ferroelectric components.

2. Related Art

A ferroelectric material may have spontaneous polarization even without any external electric field. The ferroelectric material may have any one of two stable remnant polarization states. In addition, the ferroelectric material may have a switching characteristic due to the remnant polarization whose direction varies according to an external electric field. Accordingly, the ferroelectric material may be attractive as a candidate of a material employed in nonvolatile memory cells that store binary data corresponding to a logic "0" and a logic "1". Thus, a lot of effort has been focused on applying the ferroelectric material to nonvolatile memory devices. For example, in a cell structure including one transistor and one capacitor, the ferroelectric material may be used as a dielectric layer of the capacitor. Alternatively, in a cell structure including one transistor, the ferroelectric material may be employed as a gate dielectric layer of the transistor.

SUMMARY

According to an embodiment, a ferroelectric component includes a first electrode, a tunnel barrier layer disposed on the first electrode to include a ferroelectric material, a tunneling control layer disposed on the tunnel barrier layer to control a tunneling width of electric charges passing through the tunnel barrier layer, and a second electrode disposed on the tunneling control layer. The tunneling control layer is configured to form conductive paths of electrons to reduce the tunneling width in the tunnel barrier layer or is configured to reduce a number of the conductive paths of the electrons to increase the tunneling width formed in the tunnel barrier layer, according to an external voltage applied between the first electrode and the second electrode.

According to another embodiment, a cross point array device includes a first conductive line, a second conductive line overlapping the first conductive line, and a pillar structure disposed at a cross point of the first and second electrodes. The pillar structure includes a self-rectifying layer, a tunnel barrier layer, and a tunneling control layer. The self-rectifying layer includes an insulation material. The tunnel barrier layer includes a ferroelectric material. The tunneling control layer includes a conductive material. The tunneling control layer is configured to form conductive paths of the electrons to reduce a tunneling width in the tunnel barrier layer or is configured to reduce a number of the conductive paths of the electrons to increase the tunneling width formed in the tunnel barrier layer, according to an external voltage applied between the first conductive line and the second conductive line.

BRIEF DESCRIPTION OF THE DRAWINGS

Certain features of the disclosed technology are illustrated by various embodiments with reference to the attached drawings, in which.

DETAILED DESCRIPTION

Figure 1:
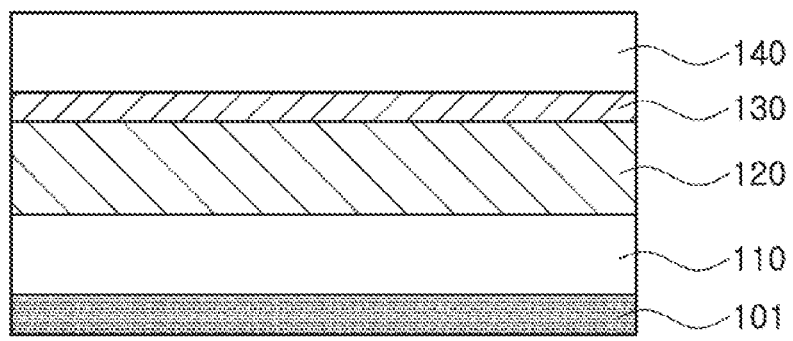
FIG. 1 is a cross-sectional view illustrating a ferroelectric component according to an embodiment of the present disclosure.

Various embodiments of the present disclosure will now be described hereinafter with reference to the accompanying drawings. The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, but not used to define only the element itself or to mean a particular sequence. Moreover, in describing the embodiments disclosed in the specification, detailed descriptions of related technologies well known in the art will be omitted when it is considered that the detailed descriptions of the related technologies make the subject matters of the embodiments unclear.

In the drawing figures, the dimensions (e.g., widths or thicknesses) of elements (e.g., layers or regions) may be exaggerated for clarity of illustration. In addition, the elements may be simplified to clearly illustrate their operations, their statuses, and relationships therebetween in the drawings. In the specification, descriptions of the drawings are based on an observer's point of view. It will be understood that when an element is referred to as being "on" another element, it can be directly "on" the other element or intervening elements may also be present. In the drawings, like reference numerals refer to like elements throughout.

As used herein, the singular terms "a," "an" and "the" are intended to include the plural forms as well, unless the context clearly indicates otherwise. It will be understood that the terms "comprise," "comprising," "includes," "including," "have", "having" and variants thereof specify the presence of stated features, integers, steps, operations, elements, and/or components, but do not preclude the presence and/or addition of one or more other features, integers, steps, operations, elements, components, and/or groups thereof. Furthermore, in method embodiments such as fabrication method embodiments, process steps of the methods may be performed in different sequences from the order which is described in the specification unless the context clearly indicates otherwise. That is, the process steps of the methods may be performed in the same sequence as described in the specification or in an opposite sequence thereto. Moreover, two or more process steps sequentially performed in an embodiment may be simultaneously performed in another embodiment.

In the present disclosure, a write operation of a ferroelectric component may mean an operation forming remnant polarization arrayed in a predetermined direction in a ferroelectric material. Furthermore, in the present disclosure, a read operation of the ferroelectric component may mean an operation that apples a voltage insufficient for changing the direction of the remnant polarization to the ferroelectric component and that measures a tunneling current flowing through the ferroelectric component. The word "predetermined" as used herein with respect to a parameter, such as a predetermined direction or predetermined voltage, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

FIG. 1 is a cross-sectional view illustrating a ferroelectric component 100A according to an embodiment of the present disclosure.

Referring to FIG. 1, the ferroelectric component 100A may include a first electrode 110, a tunnel barrier layer 120, a tunneling control layer 130, and a second electrode 140. The first electrode 110, the tunnel barrier layer 120, the tunneling control layer 130, and the second electrode 140 may be sequentially stacked on a substrate 101.

The substrate 101 may be a semiconductor substrate, an insulator substrate, or a conductor substrate. In an embodiment, the substrate 101 may be a silicon (Si) substrate, a gallium arsenide (GaAs) substrate, an indium phosphide (InP) substrate, a germanium (Ge) substrate, a silicon germanium (SiGe) substrate, or a silicon-on-insulator (SOI) substrate. In another embodiment, the substrate 101 may be a sapphire substrate, a quartz substrate, or a glass substrate. In yet another embodiment, the substrate 101 may be a doped semiconductor substrate or a conductor substrate.

Referring to FIG. 1, the first electrode 110 may be disposed on the substrate 101. The first electrode 110 may have a conductivity. The first electrode 110 may have a semiconductor-like property. For example, an electron accumulation region or an electron depletion region may be formed in a region of the first electrode 110, which is adjacent to the tunnel barrier layer 120, due to an external electric field or remnant polarization in the tunnel barrier layer 120. The first electrode 110 may include at least one selected from the group consisting of a tungsten (W) layer, a titanium (Ti) layer, a copper (Cu) layer, an aluminum (Al) layer, a ruthenium (Ru) layer, a platinum (Pt) layer, an iridium (Ir) layer, a tungsten nitride (WN) layer, a titanium nitride (TiN) layer, and a tantalum nitride (TaN) layer.

Referring to FIG. 1, the tunnel barrier layer 120 may be disposed on a surface of the first electrode 110 opposite to the substrate 101. The tunnel barrier layer 120 may include a ferroelectric material having the remnant polarization. The ferroelectric material may include a hafnium oxide material, a zirconium oxide material, or a material of a perovskite system. The ferroelectric material may include one or at least two materials selected from the group consisting of $HfO_2$, $ZrO_2$, $HF_{0.5}Zr_{0.5}O_2$, $PbZr_xTi_{1-x}O_3(0<x<1)$, $Ba(Sr,Ti)O_3$, $Bi_{4-x}La_xTi_3O_{12}(0<x<1)$, $SrBi_2Ta_2O_9$, $Pb_5Ge_5O_{11}$, $SrBi_2Nb_2O_9$, and $YMnO_3$. The tunnel barrier layer 120 may include a ferroelectric material such as a doped hafnium oxide material, a doped zirconium oxide material, or a combination thereof. In such a case, the tunnel barrier layer 120 may include carbon, silicon, magnesium, aluminum, yttrium, nitrogen, germanium, tin, strontium, lead, calcium, barium, titanium, gadolinium, lanthanum, or at least two thereof as a dopant material. The tunnel barrier layer 120 may have a thickness of 5 nanometers to 20 nanometers. However, the thickness of tunnel barrier layer 120 is not necessarily limited to the above examples. The tunnel barrier layer 120 may be implemented to have various thicknesses."

Figure 3:
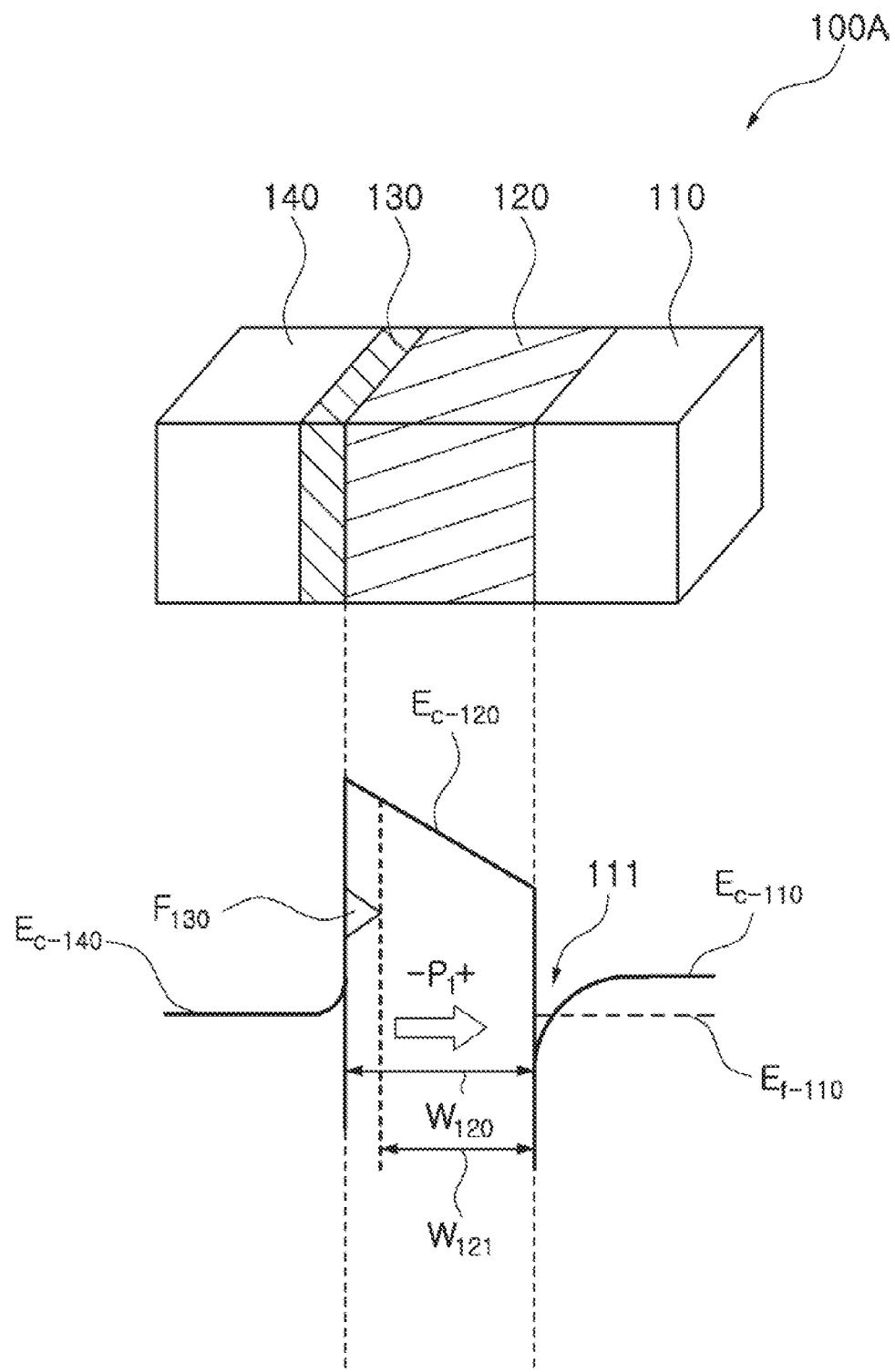
FIG. 3 illustrates an on-state of the ferroelectric component illustrated in FIG. 1.
Figure 4:
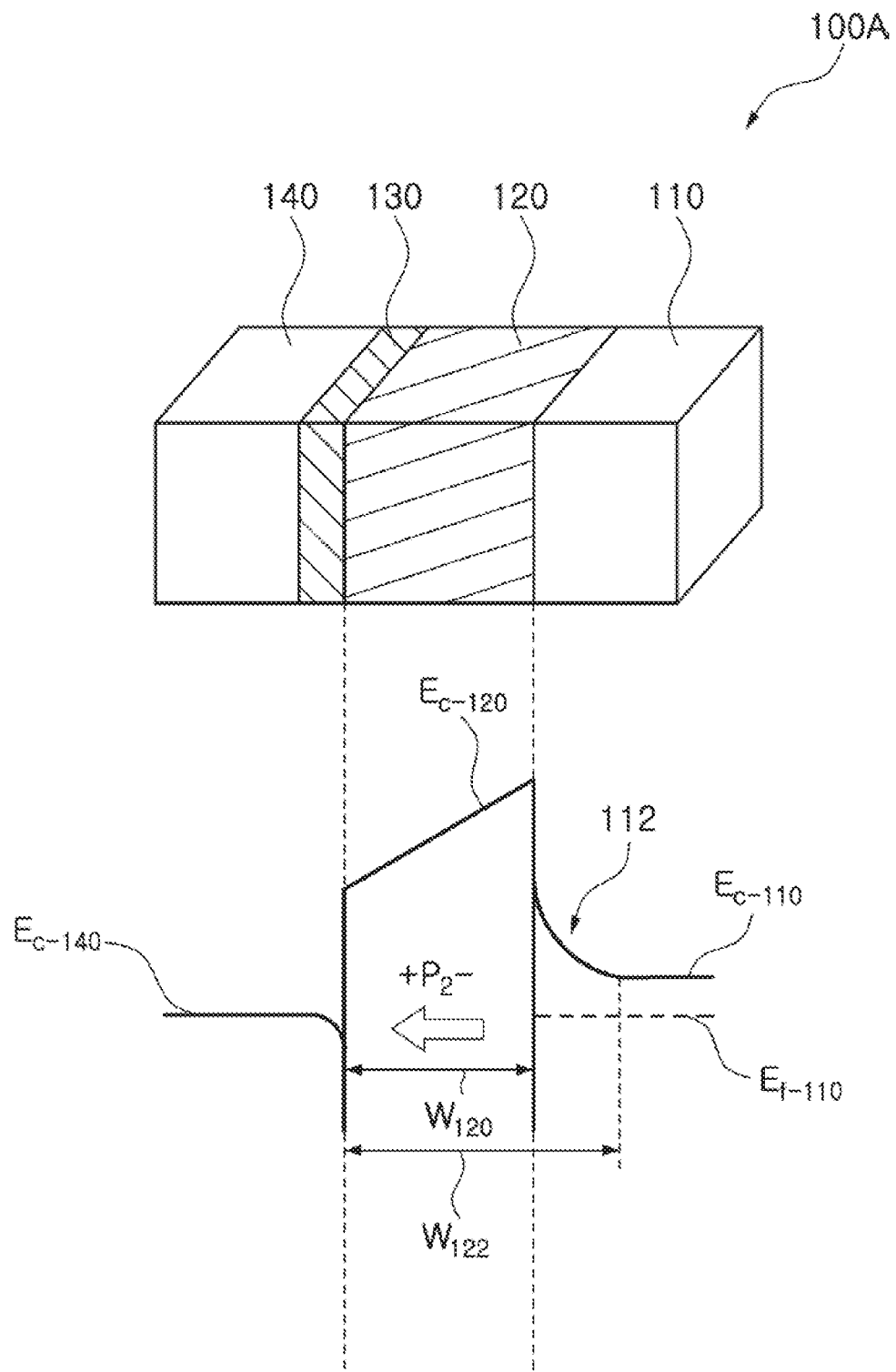
FIG. 4 illustrates an off-state of the ferroelectric component illustrated in FIG. 1.

In an embodiment, when the tunnel barrier layer 120 is disposed to be in contact with the first electrode 110, the remnant polarization formed in the tunnel barrier layer 120 may induce electrons in the first electrode 110 to an interface between the first electrode 110 and the tunnel barrier layer 120 or may repel electrons at the interface between the first electrode 110 and the tunnel barrier layer 120 into a bulk region of the first electrode 110. As a result, an electron accumulation region 111 or an electron depletion region 112 may be formed in a region of the first electrode 110 adjacent to an interface between the first electrode 110 and the tunnel barrier layer 120, as illustrated in FIGS. 3 and 4.

Referring to FIG. 1, the tunneling control layer 130 may be disposed on a surface of the tunnel barrier layer 120 opposite to the first electrode 110. As described with reference to FIGS. 3 and 4 later, the tunneling control layer 130 may induce an electric field according to a voltage applied to the ferroelectric component 100A to form a conductive path reducing a tunnel width in the tunnel barrier layer 120 or to destroy the conductive path formed in the tunnel barrier layer 120. In such a case, the electric field may be concentrated on the conductive path. As such, the tunneling control layer 130 may control a width of a tunneling layer in the tunnel barrier layer 120 through which electric charges pass.

The tunneling control layer 130 may supply metal ions into the tunnel barrier layer 120 when an external voltage is applied to the ferroelectric component 100A. The tunneling control layer 130 may include a metallic material. For example, the tunneling control layer 130 may include at least one of a silver (Ag) material and a copper (Cu) material. In such a case, the tunneling control layer 130 may supply silver ions and/or copper ions into the tunnel barrier layer 120. In an embodiment, the tunneling control layer 130 may be formed to be thinner than the second electrode 140 and the tunnel barrier layer 120. That is, the tunneling control layer 130 may be disposed between the second electrode 140 and the tunnel barrier layer 120 to function as an interfacial layer which is relatively thinner than the other layers.

Referring to FIG. 1, the second electrode 140 may be disposed on a surface of the tunneling control layer 130 opposite to the tunnel barrier layer 120. The second electrode 140 may also have a conductivity. The second electrode 140 may have an electron density which is higher than an electron density of the first electrode 110. The second electrode 140 may have no electron accumulation region or no electron depletion region in its region that is adjacent to an interface between the tunneling control layer 130 and the second electrode 140. The second electrode 140 may include at least one selected from the group consisting of a tungsten (W) layer, a titanium (Ti) layer, a copper (Cu) layer, an aluminum (Al) layer, a ruthenium (Ru) layer, a platinum (Pt) layer, an iridium (Ir) layer, a tungsten nitride (WN) layer, a titanium nitride (TiN) layer, and a tantalum nitride (TaN) layer.

Operations of the ferroelectric component 100A illustrated in FIG. 1 will be described more fully hereinafter with reference to FIGS. 2 to 4. For the purpose of ease and convenience in explanation, the substrate 101 shown in FIG. 1 is omitted in FIGS. 2 to 4.

Figure 2:
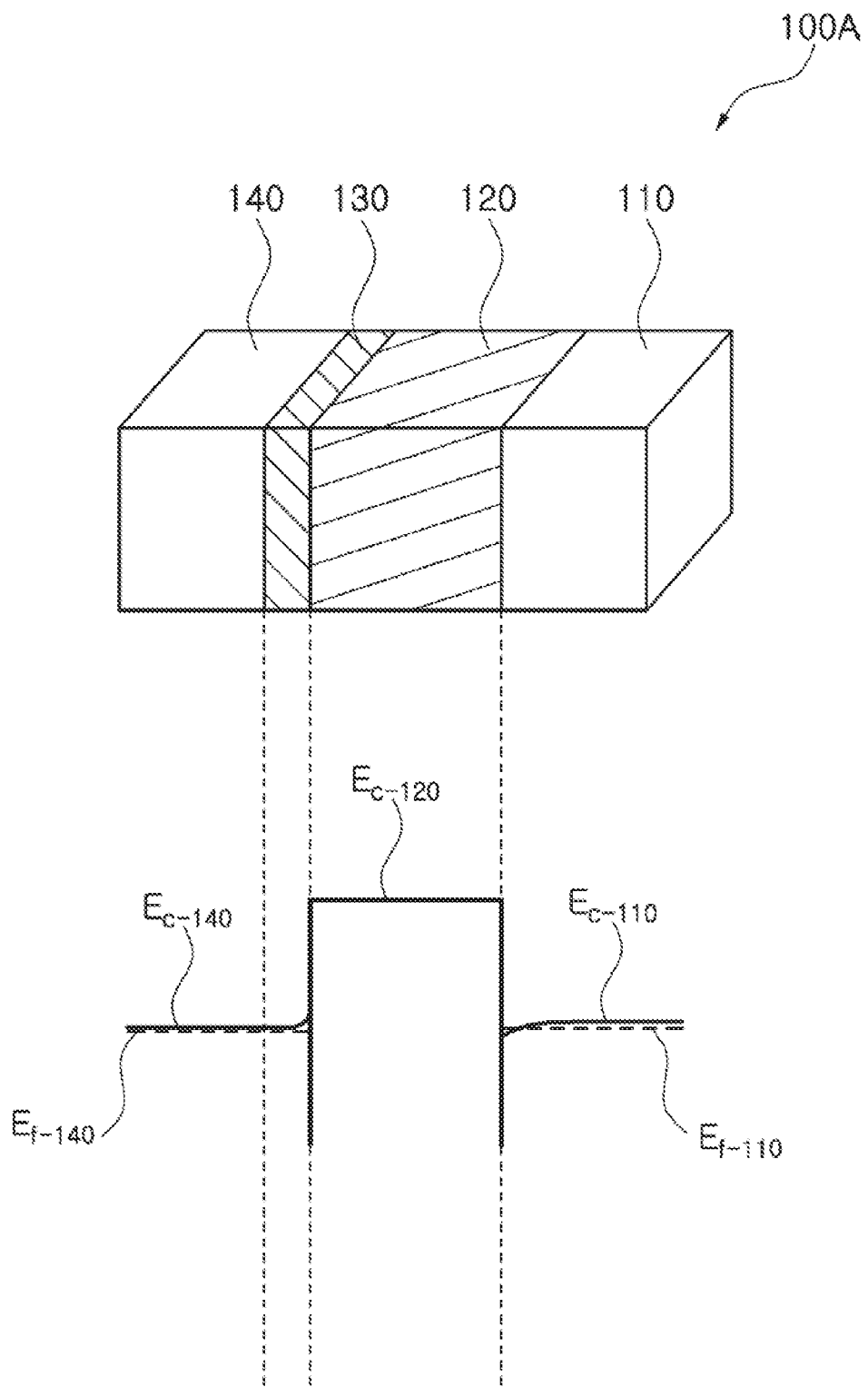
FIG. 2 illustrates an initial state of the ferroelectric component illustrated in FIG. 1.

FIG. 2 illustrates an initial state of the ferroelectric component 100A illustrated in FIG. 1.

Referring to FIG. 2, the first electrode 110, the tunnel barrier layer 120, the tunneling control layer 130, and the second electrode 140 are sequentially stacked to constitute the ferroelectric component 100A. The tunneling control layer 130 may be formed to be thinner than the other layers. Because the tunnel barrier layer 120 is an insulation layer, the tunnel barrier layer 120 may have a relatively high conduction band energy potential $E_{C\text{-}120}$ as compared with the other layers.

In an embodiment, a fermi energy potential and a conduction band energy potential of the tunneling control layer 130 may be substantially the same as a fermi energy potential $E_{f\text{-}140}$ and a conduction band energy potential $E_{C\text{-}140}$ of the second electrode 140, respectively. After the ferroelectric component 100A is fabricated, a fermi energy potential $E_{f\text{-}110}$ of the first electrode 110 may have substantially the same level as the fermi energy potential $E_{f\text{-}140}$ of the second electrode 140 in a thermal equilibrium state. In FIG. 2, the fermi energy potential $E_{f\text{-}110}$ of the first electrode 110 and the fermi energy potential $E_{f\text{-}140}$ of the second electrode 140 are illustrated by dotted lines. In addition, as illustrated in FIG. 2, a conduction band energy potential $E_{C\text{-}110}$ of the first electrode 110 may be bent in an interfacial region of the first electrode 110 adjacent to the tunnel barrier layer 120 in a thermal equilibrium state, and the conduction band energy potential $E_{C\text{-}140}$ of the tunneling control layer 130 may also be bent in an interfacial region of the tunneling control layer 130 adjacent to the tunnel barrier layer 120 in a thermal equilibrium state. In FIG. 2, the conduction band energy potential $E_{C\text{-}110}$ of the first electrode 110 and the conduction band energy potential $E_{C\text{-}140}$ of the tunneling control layer 130 are illustrated by solid lines. After the ferroelectric component 100A is fabricated, no remnant polarization may exist in the tunnel barrier layer 120 including a ferroelectric material in an initial state that no voltage is applied between the first and second electrodes 110 and 140.

FIG. 3 illustrates an on-state of the ferroelectric component 100A illustrated in FIG. 1.

Referring to FIG. 3, a first write voltage may be applied between the first and second electrodes 110 and 140 to perform a first write operation of the ferroelectric component 100A. The first write operation may be an operation for switching the ferroelectric component 100A into an on-state and for storing the on-state therein. The term "on-state" means that the tunnel barrier layer 120 of the ferroelectric component 100A has an electrical conductivity. That is, the term "on-state" means that an electrical resistance value of the tunnel barrier layer 120 is relatively low as compared to an "off-state." In contrast, the term "off-state" used hereinafter means that the tunnel barrier layer 120 of the ferroelectric component 100A has an electric insulation state. That is, the term "off-state" means that an electrical resistance value of the tunnel barrier layer 120 is relatively high as compared to the "on-state."

Referring again to FIG. 3, FIG. 3 illustrates a state of the ferroelectric component 100A, the first write operation of which terminates. The first write operation may be performed by applying the first write voltage, which is sufficient to switch a direction of the polarization of the ferroelectric material in the tunnel barrier layer 120, between the first and second electrodes 110 and 140. The first write voltage may correspond to a voltage between the first and second electrodes 110 and 140 when a bias applied to the second electrode 140 has a positive polarity and a bias applied to the first electrode 110 has a negative polarity.

When the first write voltage is applied to the ferroelectric component 100A, the polarization in the tunnel barrier layer 120 may be formed to have a first polarization direction P1. Even after the first write voltage is removed from the ferroelectric component 100A, remnant polarization having the first polarization direction P1 may remain in the tunnel barrier layer 120. The first polarization direction P1 may be a direction from the second electrode 140 toward the first electrode 110. In other words, the first write operation may be an operation for forming the remnant polarization having the first polarization direction P1 in the tunnel barrier layer 120 by applying the first write voltage to the ferroelectric component 100A.

Meanwhile, the remnant polarization having the first polarization direction P1 may induce electrons into a region of the first electrode 110, which is adjacent to an interface between the tunnel barrier layer 120 and the first electrode 110. The induced electrons may form the electron accumulation region 111 in an internal region of the first electrode 110, which is adjacent to an interface between the tunnel barrier layer 120 and the first electrode 110. Accordingly, as compared with the ferroelectric component 100A having the initial state illustrated in FIG. 2, the conduction band energy potential $E_{C\text{-}110}$ of the first electrode 110 illustrated in FIG. 3 may become lower than the fermi energy potential $E_{f\text{-}110}$ of the first electrode 110 at a region adjacent to the interface between the tunnel barrier layer 120 and the first electrode 110. In addition, the conduction band energy potential $E_{C\text{-}120}$ of the tunnel barrier layer 120 may be inclined as illustrated in FIG. 3. The conduction band energy potential $E_{C\text{-}140}$ of the second electrode 140 may also be bent at the interface between the tunnel barrier layer 120 and the tunneling control layer 130.

Referring still to FIG. 3, when the first write voltage is applied between the first and second electrode 110 and 140, metal atoms in the tunneling control layer 130 may be changed into metal ions and the metal ions in the tunneling control layer 130 may be supplied into the tunnel barrier layer 120. The metal ions drifted into the tunnel barrier layer 120 may be combined with electrons emitted from the first electrode 110 to form a conductive filament F130 in the tunnel barrier layer 120. The conductive filament F130 may function as a conductive path of the electrons and may extend from the interface between the tunneling control layer 130 and the tunnel barrier layer 120 into an internal region of the tunnel barrier layer 120. In such a case, the conductive filament F130 may be formed not to reach the first electrode 110. Even after the first write voltage is removed from the ferroelectric component 100A, the conductive filament F130 may still remain in the tunnel barrier layer 120. In an embodiment, the when the first write voltage is applied between the first and second electrode 110 and 140, the tunneling control layer 130 may be used to form conductive paths in the tunnel barrier layer 120.

For the purpose of ease and convenience in understanding, it may be assumed that the tunneling control layer 130 includes a silver (Ag) material. When a positive bias of the first write voltage is applied to the second electrode 140, the silver (Ag) material in the tunneling control layer 130 contacting the second electrode 140 may be oxidized to provide silver ions having positive charges and the positive silver ions may be drifted into the tunnel barrier layer 120. Subsequently, the silver ions may be combined with the electrons emitted from the first electrode 110 to form silver atoms. Those silver atoms may be accumulated at the interface between the tunneling control layer 130 and the tunnel barrier layer 120. The accumulated silver atoms may grow along an electric field created by the first write voltage to form the conductive filament F130 extending from the interface between the tunneling control layer 130 and the tunnel barrier layer 120 into the tunnel barrier layer 120. In such a case, the conductive filament F130 may be formed not to reach the first electrode 110. Because the conductive filament F130 provides a conductive path of electrons, a tunneling width W120 of the tunnel barrier layer 120 through which the electrons substantially tunnel may be reduced when an external voltage is applied to the ferroelectric component 100A. That is, as illustrated in FIG. 3, a tunneling width W121 of the tunnel barrier layer 120 through which the electrons pass to generate a tunneling current may be less than the tunneling width W120 of the tunnel barrier layer 120 having the initial state illustrated in FIG. 2 by a width of the conductive filament F130.

As described above, the tunnel barrier layer 120 may preserve the remnant polarization having the first polarization direction P1 therein even after the first write voltage is removed from the ferroelectric component 100A. Thus, the electron accumulation region 111 may exist in the first electrode 110 even after the first write voltage is removed from the ferroelectric component 100A. In addition, the conductive filament F130 may also remain in the tunnel barrier layer 120. Accordingly, the electron accumulation region 111 formed by the first write operation may increase a tunneling probability of the electrons when a negative bias is applied to the first electrode 110 by an external voltage or a positive bias is applied to the second electrode 140 by an external voltage. In addition, the conductive filament F130 may also increase a tunneling probability of the electrons when a negative bias is applied to the second electrode 140 by an external voltage or a positive bias is applied to the first electrode 110 by an external voltage. Thus, as compared with the ferroelectric component 100A having the initial state illustrated in FIG. 2, the ferroelectric component 100A having the on-state illustrated in FIG. 3 may function as a switch which is electrically turned on when an external voltage is applied to the ferroelectric component 100A.

In conclusion, the ferroelectric component 100A illustrated in FIG. 3 may act as a nonvolatile memory cell in which a first logic information (i.e., a first logic datum) corresponding to the on-state is stored after the first write operation is performed. Meanwhile, the information corresponding to the on-state stored in the ferroelectric component 100A may be read out by applying a read voltage to the ferroelectric component 100A. The read voltage may be a voltage having the same polarity as the first write voltage or having a polarity different from the first write voltage. However, a level of the read voltage may be lower than a level of the first write voltage such that a direction of the remnant polarization formed in the tunnel barrier layer 120 is not changed and the conductive filament F130 formed in the tunnel barrier layer 120 is not removed.

As described above, when the ferroelectric component 100A has the on-state, the first electrode 110 may supply sufficient electrons for tunneling due to the presence of the electron accumulation region 111 formed in a region of the first electrode 110 adjacent to the interface between the first electrode 110 and the tunnel barrier layer 120 as compared with the ferroelectric component 100A having the off-state illustrated in FIG. 4. Thus, the ferroelectric component 100A having the on-state may exhibit a relatively low resistance value as compared with the ferroelectric component 100A having the off-state because a tunneling efficiency of electrons passing through the tunnel barrier layer 120 increases in the ferroelectric component 100A having the on-state. In addition, when the read voltage is applied to the ferroelectric component 100A having the on-state, an amount of a tunneling current flowing through the ferroelectric component 100A may be proportional to a magnitude of the read voltage. The first logic information stored in the ferroelectric component 100A having the on-state may be read out using the characteristic of the ferroelectric component 100A having the on-state.

Moreover, as described above, the tunneling width W121 of the tunnel barrier layer 120 in the on-state may be less than the tunneling width W120 of the tunnel barrier layer 120 in the initial state due to the presence of the conductive filament F130. Thus, a tunneling current flowing through the tunnel barrier layer 120 when the read voltage is applied to the ferroelectric component 100A having the on-state may increase due to the presence of the conductive filament F130 as compared with a case that no conductive filament exists in the tunnel barrier layer 120. As a result, the tunneling current of the ferroelectric component 100A including the conductive filament F130 may increase to effectively read out the first logic information stored in the ferroelectric component 100A.

FIG. 4 illustrates the off-state of the ferroelectric component 100A illustrated in FIG. 1.

Referring to FIG. 4, a second write voltage may be applied between the first and second electrodes 110 and 140 to perform a second write operation of the ferroelectric component 100A. The second write operation may be an operation for switching the ferroelectric component 100A into the off-state and for storing the off-state therein.

Referring again to FIG. 4, FIG. 4 illustrates a state of the ferroelectric component 100A, the second write operation of which terminates. The second write operation may be performed by applying the second write voltage, which is sufficient to switch a direction of the polarization of the ferroelectric material in the tunnel barrier layer 120, between the first and second electrodes 110 and 140. The second write voltage may correspond to a voltage between the first and second electrodes 110 and 140 when a bias applied to the second electrode 140 has a negative polarity and a bias applied to the first electrode 110 has a positive polarity.

When the second write voltage is applied to the ferroelectric component 100A, the polarization in the tunnel barrier layer 120 may be formed to have a second polarization direction P2 opposite to the first polarization direction P1. Even after the second write voltage is removed from the ferroelectric component 100A, remnant polarization having the second polarization direction P2 may remain in the tunnel barrier layer 120. The second polarization direction P2 may be a direction from the first electrode 110 toward the second electrode 140. In other words, the second write operation may be an operation for forming the remnant polarization having the second polarization direction P2 in the tunnel barrier layer 120 by applying the second write voltage to the ferroelectric component 100A.

Meanwhile, the remnant polarization having the second polarization direction P2 may form the electron depletion region 112 in an internal region of the first electrode 110, which is adjacent to an interface between the tunnel barrier layer 120 and the first electrode 110. Accordingly, as compared with the ferroelectric component 100A having the initial state illustrated in FIG. 2, the conduction band energy potential $E_{C-110}$ of the first electrode 110 illustrated in FIG. 4 may be located over the fermi energy potential $E_{f-110}$ of the first electrode 110 and may be gradually increased as it becomes closer to the interface between the tunnel barrier layer 120 and the first electrode 110. The conduction band energy potential $E_{C-140}$ of the second electrode 140 may also be bent at the interface between the tunnel barrier layer 120 and the tunneling control layer 130. In such a case, the conduction band energy potential $E_{C-120}$ of the tunnel barrier layer 120 may be inclined as illustrated in FIG. 4.

For the purpose of ease and convenience in understanding, it may be assumed that the second write voltage is applied to the ferroelectric component 100A including the conductive filament F130 formed of the silver (Ag) atoms in the tunnel barrier layer 120. In such a case, the conductive filament F130 may be decomposed by the second write voltage so that the conductive filament F130 is removed or the number of the conductive filaments F130 is reduced as compared with the ferroelectric component 100A having the on-state. The decomposition of the conductive filament F130 may be due to a phenomenon that the conductive filament F130 is oxidized by joule heat generated by the conductive filament F130 when the second write voltage is applied to the ferroelectric component 100A.

As described above, the tunnel barrier layer 120 may preserve the remnant polarization having the second polarization direction P2 therein even after the second write voltage is removed from the ferroelectric component 100A. Thus, the electron depletion region 112 may exist in the first electrode 110 even after the second write voltage is removed from the ferroelectric component 100A. In addition, the conductive filament F130 in the tunnel barrier layer 120 may be removed or the number of the conductive filaments F130 in the tunnel barrier layer 120 is reduced after the second write operation. Accordingly, the electron depletion region 112 formed by the second write operation may lower a tunneling probability of the electrons when a negative bias is applied to the first electrode 110 by an external voltage or a positive bias is applied to the second electrode 140 by an external voltage. In addition, because the conductive filament F130 in the tunnel barrier layer 120 is removed or the number of the conductive filaments F130 is reduced after the second write operation, a tunneling probability of the electrons may be lowered when a negative bias is applied to the second electrode 140 by an external voltage or a positive bias is applied to the first electrode 110 by an external voltage. As a result, as compared with the ferroelectric component 100A having the initial state illustrated in FIG. 2 and the ferroelectric component 100A having the on-state illustrated in FIG. 3, the ferroelectric component 100A having the off-state illustrated in FIG. 4 may function as a switch which is electrically turned off when an external voltage is applied to the ferroelectric component 100A.

In conclusion, the ferroelectric component 100A illustrated in FIG. 4 may act as a nonvolatile memory cell in which a second logic information (i.e., a second logic datum) corresponding to the off-state is stored after the second write operation is performed. Meanwhile, the information corresponding to the off-state stored in the ferroelectric component 100A may be read out by applying the read voltage to the ferroelectric component 100A.

As described above, in the off-state of the ferroelectric component 100A, the first electrode 110 may supply electrons insufficient for tunneling because of the presence of the electron depletion region 112 formed in a region of the first electrode 110 adjacent to the interface between the first electrode 110 and the tunnel barrier layer 120 as compared with the ferroelectric component 100A having the on-state illustrated in FIG. 3. Thus, the ferroelectric component 100A having the off-state may exhibit a relatively high resistance value as compared with the ferroelectric component 100A having the on-state because a tunneling efficiency of electrons passing through the tunnel barrier layer 120 is reduced in the ferroelectric component 100A having the off-state. In addition, when the read voltage is applied to the ferroelectric component 100A having the off-state, a tunneling current flowing through the ferroelectric component 100A may be a small current corresponding to a leakage current of an insulation layer even though a magnitude of the read voltage increases. The second logic information stored in the ferroelectric component 100A having the off-state may be read out using the characteristic of the ferroelectric component 100A having the off-state.

Moreover, a tunneling width W122 of a substantial layer through which the electrons actually pass in the off-state of the ferroelectric component 100A may be greater than the tunneling width W120 of the tunnel barrier layer 120 by a width of the electron depletion region 112 because of the presence of the electron depletion region 112. In addition, because the conductive filament F130 formed in the on-state is removed or the number of the conductive filaments F130 is reduced after the second write operation, a tunneling width in the ferroelectric component 100A having the off-state may be more increased as compared with the tunneling width of the ferroelectric component 100A having the on-state. Thus, a tunneling probability that the electrons pass through the tunnel barrier layer 120 may be lowered as compared with a tunneling probability of the electrons in the ferroelectric component 100A having the on-state. As a result, the second logic information stored the ferroelectric component 100A during the second write operation may be effectively read out.

As described with reference to FIGS. 1 to 4, a predetermined voltage may be applied between the first and second electrodes 110 and 140 to form an electron accumulation region or an electron depletion region in the first electrode 110 by controlling a direction of remnant polarization of a ferroelectric material included in the tunnel barrier layer 120. Thus, the ferroelectric component 100A may function as a nonvolatile memory cell storing one of first logic information and second logic information which are different from each other. In such a case, the first logic information or the second logic information stored in the ferroelectric component 100A may be read out by measuring a tunneling current that flows through the tunnel barrier layer 120. Furthermore, when the first write operation is performed such that the ferroelectric component 100A has the on-state, conductive paths may be formed in the tunnel barrier layer 120 to reduce a tunneling width of the tunnel barrier layer 120. In contrast, when the second write operation is performed such that the ferroelectric component 100A has the off-state, the conductive paths formed in the tunnel barrier layer 120 may be removed or the number of the conductive paths may be reduced. As such, if the tunneling width is reduced in the on-state of the ferroelectric component 100A, an amount of a tunneling current flowing through the tunnel barrier layer 120 may increase. In addition, if the conductive paths formed in the tunnel barrier layer 120 may be removed or the number of the conductive paths may be reduced in the off-state of the ferroelectric component 100A, the tunneling current in the off-state may be more effectively blocked. As a result, a sensing efficiency of the first or second logic information may be improved by measuring the tunneling current of the ferroelectric component 100A having the on-state or the off-state.

Figure 5:
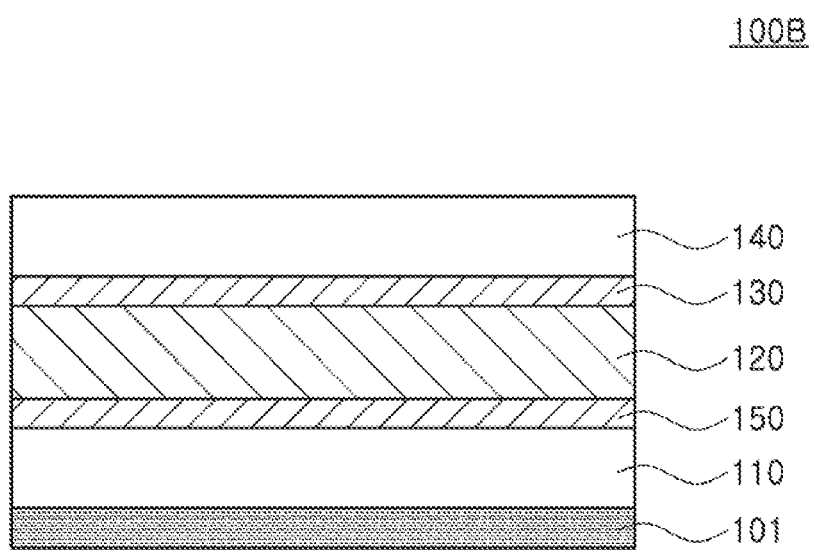
FIG. 5 is a cross-sectional view illustrating a ferroelectric component according to another embodiment of the present disclosure.

FIG. 5 is a cross-sectional view illustrating a ferroelectric component 100B according to another embodiment of the present disclosure.

Referring to FIG. 5, the ferroelectric component 100B may further include a self-rectifying layer 150 as compared with the ferroelectric component 100A described with reference to FIGS. 1 to 4. That is, the ferroelectric component 100B may include the first electrode 110, the self-rectifying layer 150, the tunnel barrier layer 120, the tunneling control layer 130, and the second electrode 140. Accordingly, the first electrode 110, the tunnel barrier layer 120, the tunneling control layer 130, and the second electrode 140 illustrated in FIG. 5 may be substantially the same layers as the first electrode 110, the tunnel barrier layer 120, the tunneling control layer 130, and the second electrode 140 described with reference to FIGS. 1 to 4. Thus, descriptions of the first electrode 110, the tunnel barrier layer 120, the tunneling control layer 130, and the second electrode 140 will be omitted hereinafter to avoid duplicate explanation.

Referring to FIG. 5, the self-rectifying layer 150 may be disposed between the first electrode 110 and the tunnel barrier layer 120. When the self-rectifying layer 150 is disposed between the first electrode 110 and the tunnel barrier layer 120, an electron accumulation region or an electron depletion region may be formed in a region of the first electrode 110, which extends from the interface between the first electrode 110 and the self-rectifying layer 150 into the first electrode 110. In addition, a conductive path formed in the tunnel barrier layer 120 by an external field may be formed not to reach the self-rectifying layer 150.

The self-rectifying layer 150 may have one of a conductive state and an insulation state according to a polarity of an external voltage applied to the ferroelectric component 100B. That is, the self-rectifying layer 150 may minimize a current from flowing through the tunnel barrier layer 120. Thus, the self-rectifying layer 150 may function as a selection element such as a switch or a diode. For example, when a first voltage is applied to the ferroelectric component 100B such that a positive bias is applied to the second electrode 140 and a negative bias is applied to the first electrode 110, the self-rectifying layer 150 may have a characteristic that an amount of a current flowing through the self-rectifying layer 150 is proportional to a magnitude of the first voltage. Alternatively, when a second voltage is applied to the ferroelectric component 100E such that a negative bias is applied to the second electrode 140 and a positive bias is applied to the first electrode 110, the self-rectifying layer 150 may exhibit a characteristic that only a small current corresponding to a leakage current of an insulation layer flows through the self-rectifying layer 150 even though a magnitude of the second voltage increases.

The self-rectifying layer 150 may include a dielectric material or an insulation material. For example, the self-rectifying layer 150 may include a tantalum oxide ($Ta_2O_5$) material, a titanium oxide ($TiO_2$) material, an aluminum oxide ($Al_2O_3$) material, a zinc oxide (ZnO) material, or at least two thereof.

Operations of the ferroelectric component 100B illustrated in FIG. 5 will be described more fully hereinafter with reference to FIGS. 6 to 8. For the purpose of ease and convenience in explanation, the substrate 101 shown in FIG. 5 is omitted in FIGS. 6 to 8.

Figure 6:
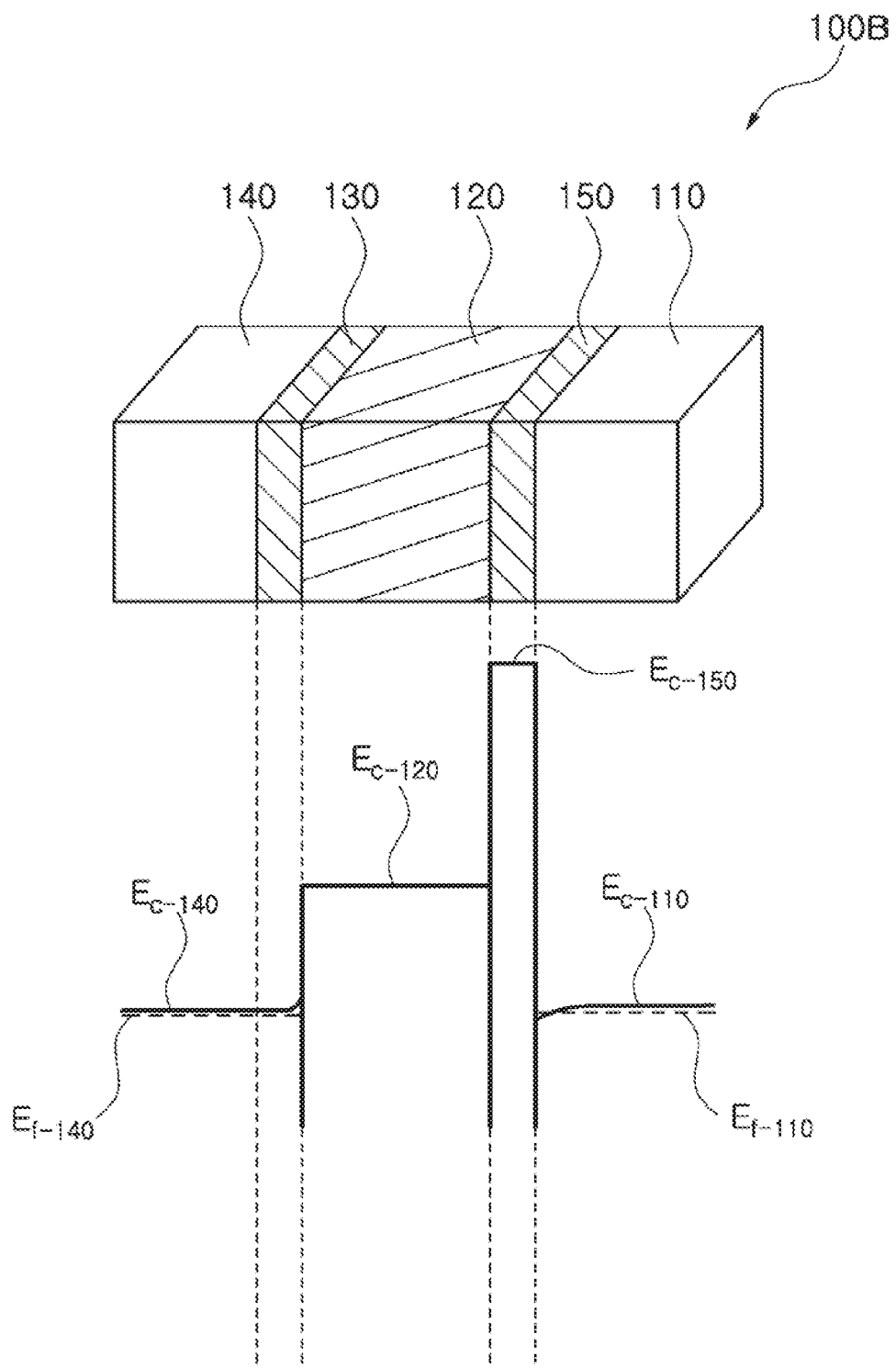
FIG. 6 illustrates an initial state of the ferroelectric component illustrated in FIG. 5.

FIG. 6 illustrates an initial state of the ferroelectric component 100B illustrated in FIG. 5.

Referring to FIG. 6, the first electrode 110, the self-rectifying layer 150, the tunnel barrier layer 120, the tunneling control layer 130, and the second electrode 140 are sequentially stacked to constitute the ferroelectric component 100B. The self-rectifying layer 150 may have a conduction band energy potential $E_{C-150}$ which is highest as compared with the other layers because the self-rectifying layer 150 includes an insulation material. The conduction band energy potential $E_{C-120}$ of the tunnel barrier layer 120 may be higher than the conduction band energy potentials $E_{C-110}$ and $E_{C-140}$ of the first electrode 110 and the second electrode 140 and may be lower than the conduction band energy potential $E_{C-150}$ of the self-rectifying layer 150. The first and second electrodes 110 and 140 and the tunneling control layer 130 included in the ferroelectric component 100B may have substantially the same fermi energy potentials and the same conduction band energy potentials as the first and second electrodes 110 and 140 and the tunneling control layer 130 included in the ferroelectric component 100A illustrated in FIG. 2. Thus, descriptions of the fermi energy potentials and the conduction band energy potentials of the first and second electrodes 110 and 140 and the tunneling control layer 130 included in the ferroelectric component 100B will be omitted hereinafter.

Figure 7:
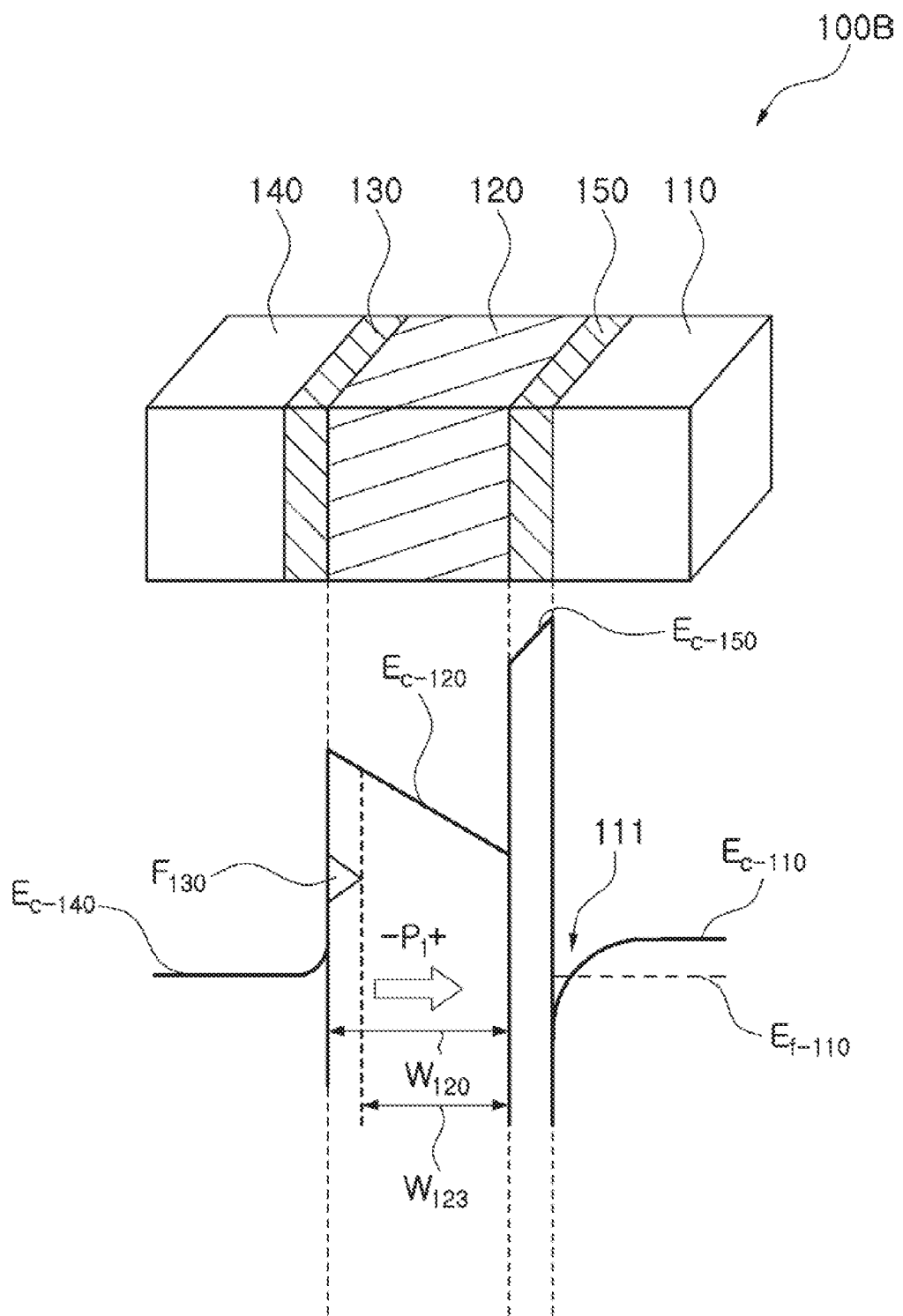
FIG. 7 illustrates an on-state of the ferroelectric component illustrated in FIG. 5.

FIG. 7 illustrates an on-state of the ferroelectric component 100B illustrated in FIG. 5.

Referring to FIG. 7, a first write voltage may be applied between the first and second electrodes 110 and 140 to perform a first write operation of the ferroelectric component 100B. The first write operation may be an operation for switching the ferroelectric component 100E into an on-state and for storing the on-state therein. The first write operation according to an embodiment may be similar to the first write operation described with reference to FIG. 3 except the presence of the self-rectifying layer 150. Thus, the same description as described with reference to FIG. 3 in terms of the first write operation will be omitted hereinafter.

If the first write voltage is applied to the ferroelectric component 100B, the polarization in the tunnel barrier layer 120 may be formed to have the first polarization direction P1. Meanwhile, remnant polarization having the first polarization direction P1 in the tunnel barrier layer 120 may induce electrons into a region of the first electrode 110, which is adjacent to an interface between the self-rectifying layer 150 and the first electrode 110. The induced electrons may form the electron accumulation region 111 in an internal region of the first electrode 110, which is adjacent to an interface between the self-rectifying layer 150 and the first electrode 110. Accordingly, as compared with the ferroelectric component 1008 having the initial state illustrated in FIG. 6, the conduction band energy potential $E_{C\text{-}110}$ of the first electrode 110 illustrated in FIG. 3 may become lower than the fermi energy potential $E_{f\text{-}110}$ of the first electrode 110 at a region adjacent to the interface between the self-rectifying layer 150 and the first electrode 110, In addition, the conduction band energy potential $E_{C\text{-}150}$ of the self-rectifying layer 150 may be inclined as illustrated in FIG. 7. The conduction band energy potential $E_{C\text{-}140}$ of the second electrode 140 may also be bent at the interface between the tunnel barrier layer 120 and the tunneling control layer 130.

Even after the first write voltage is removed from the ferroelectric component 100B, the remnant polarization having the first polarization direction P1 may remain in the tunnel barrier layer 120. Thus, the electron accumulation region 111 may still exist in the first electrode 110 even after the first write voltage is removed from the ferroelectric component 100B.

The ferroelectric component 100B may act as a nonvolatile memory cell in which the first logic information corresponding to the on-state is stored after the first write operation is performed. Meanwhile, the information corresponding to the on-state stored in the ferroelectric component 100B may be read out by applying the read voltage to the ferroelectric component 100B. In such a case, the self-rectifying layer 150 may function as a selection element such as a switch or a diode, as described previously. That is, when a positive bias is applied to the second electrode 140 and a negative bias of the read voltage is applied to the first electrode 110, a slope of the conduction band energy potential $E_{C\text{-}150}$ of the self-rectifying layer 150 may become steeper. Accordingly, a substantial electron tunneling width of the ferroelectric component 100B may be reduced. As a result, a tunneling efficiency of electrons drifted from the first electrode 110 toward the second electrode 140 may be improved to increase an amount of a tunneling current according to a magnitude of the read voltage applied to the ferroelectric component 100B. In contrast, when a negative bias is applied to the second electrode 140 and a positive bias of the read voltage is applied to the first electrode 110, a slope of the conduction band energy potential $E_{C\text{-}150}$ of the self-rectifying layer 150 may become gentler. Accordingly, a substantial electron tunneling width of the ferroelectric component 100B may increase to restrict the tunneling current flowing from the first electrode 110 toward the second electrode 140. In such a case, even though a magnitude of the read voltage increases, the tunneling current may be a small current corresponding to a leakage current of an insulation layer. Thus, the read voltage may be a voltage having a positive bias applied to the second electrode 140 and a negative bias applied to the first electrode 110. An absolute value of the read voltage may be less than an absolute value of the first write voltage such that a direction of the remnant polarization formed in the tunnel barrier layer 120 is not changed and the conductive filament F130 formed in the tunnel barrier layer 120 is not removed.

Figure 8:
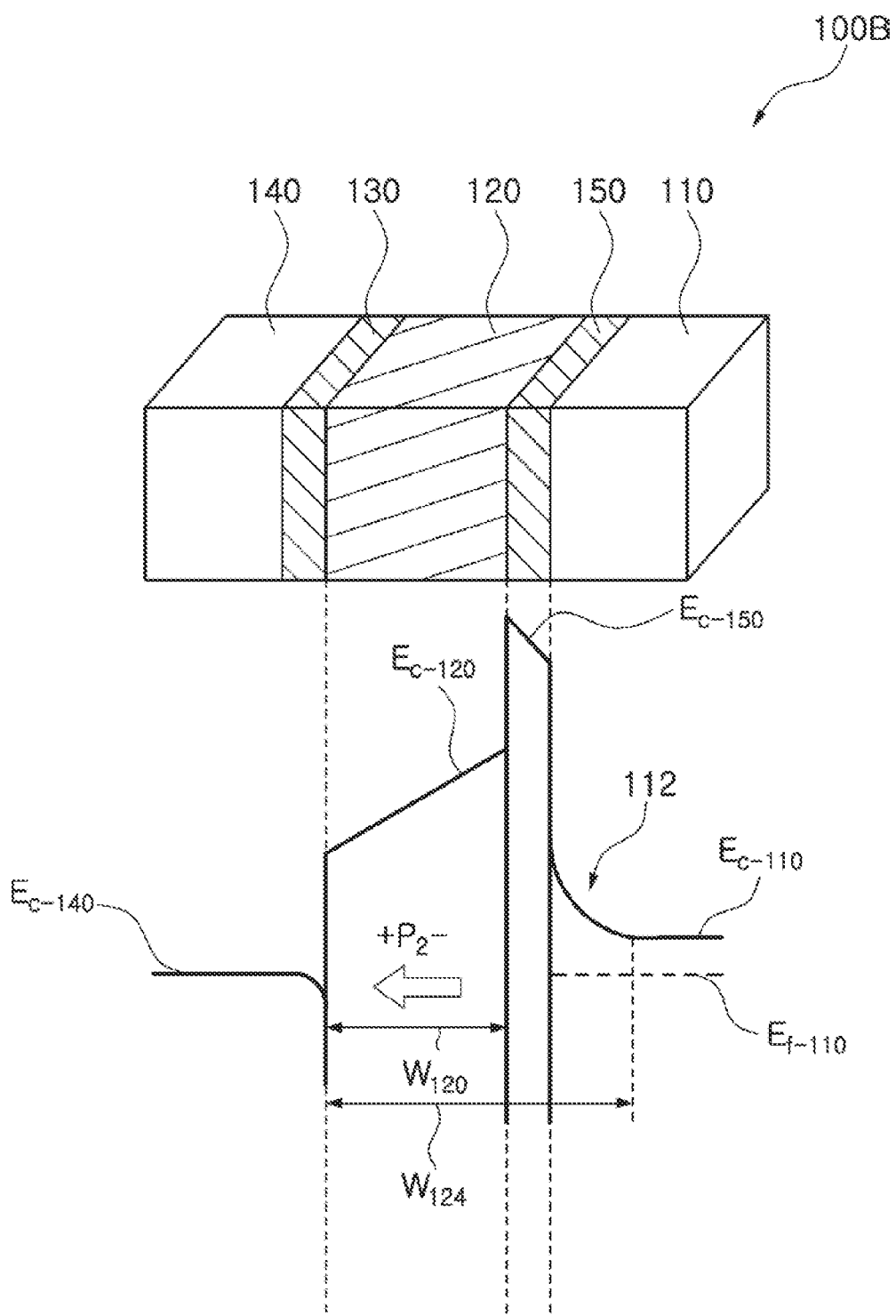
FIG. 8 illustrates an off-state of the ferroelectric component illustrated in FIG. 5.

FIG. 8 illustrates the off-state of the ferroelectric component 100B illustrated in FIG. 5.

Referring to FIG. 8, a second write voltage may be applied between the first and second electrodes 110 and 140 to perform a second write operation of the ferroelectric component 100B. The second write operation may be an operation for switching the ferroelectric component 100B into the off-state and for storing the off-state therein. The second write operation according to an embodiment may be similar to the second write operation described with reference to FIG. 4 except the presence of the self-rectifying layer 150. Thus, the same description as described with reference to FIG. 4 in terms of the second write operation will be omitted hereinafter.

When the second write voltage is applied to the ferroelectric component 100B, the polarization in the tunnel barrier layer 120 may be formed to have a second polarization direction P2 opposite to the first polarization direction P1.

Meanwhile, the remnant polarization having the second polarization direction P2 may form the electron depletion region 112 in an internal region of the first electrode 110, which is adjacent to an interface between the self-rectifying layer 150 and the first electrode 110. Accordingly, as compared with the ferroelectric component 100B having the initial state illustrated in FIG. 6, the conduction band energy potential $E_{C\text{-}110}$ of the first electrode 110 illustrated in FIG. 8 may be located over the fermi energy potential $E_{f\text{-}110}$ of the first electrode 110 and may be gradually increased as it becomes closer to the interface between the self-rectifying layer 150 and the first electrode 110. The conduction band energy potential $E_{C\text{-}140}$ of the second electrode 140 may also be bent at the interface between the tunnel barrier layer 120 and the tunneling control layer 130. In such a case, the conduction band energy potential $E_{C\text{-}120}$ of the tunnel barrier layer 120 and the conduction band energy potential $E_{C\text{-}150}$ of the self-rectifying layer 150 may be inclined as illustrated in FIG. 8.

The tunnel barrier layer 120 may preserve the remnant polarization having the second polarization direction P2 therein even after the second write voltage is removed from the ferroelectric component 100B. Thus, the electron depletion region 112 may exist in the first electrode 110 even after the second write voltage is removed from the ferroelectric component 100B.

The ferroelectric component 100B illustrated in FIG. 8 may act as a nonvolatile memory cell in which a second logic information corresponding to the off-state is stored after the second write operation is performed. Meanwhile, the information corresponding to the off-state stored in the ferroelectric component 100B may be read out by applying the read voltage described with reference to FIG. 7 to the ferroelectric component 100B. That is, because the self-rectifying layer 150 functions as a selection element such as a switch or a diode as described above, the read voltage may be a voltage having a positive bias applied to the second electrode 140 and a negative bias applied to the first electrode 110.

Figure 9:
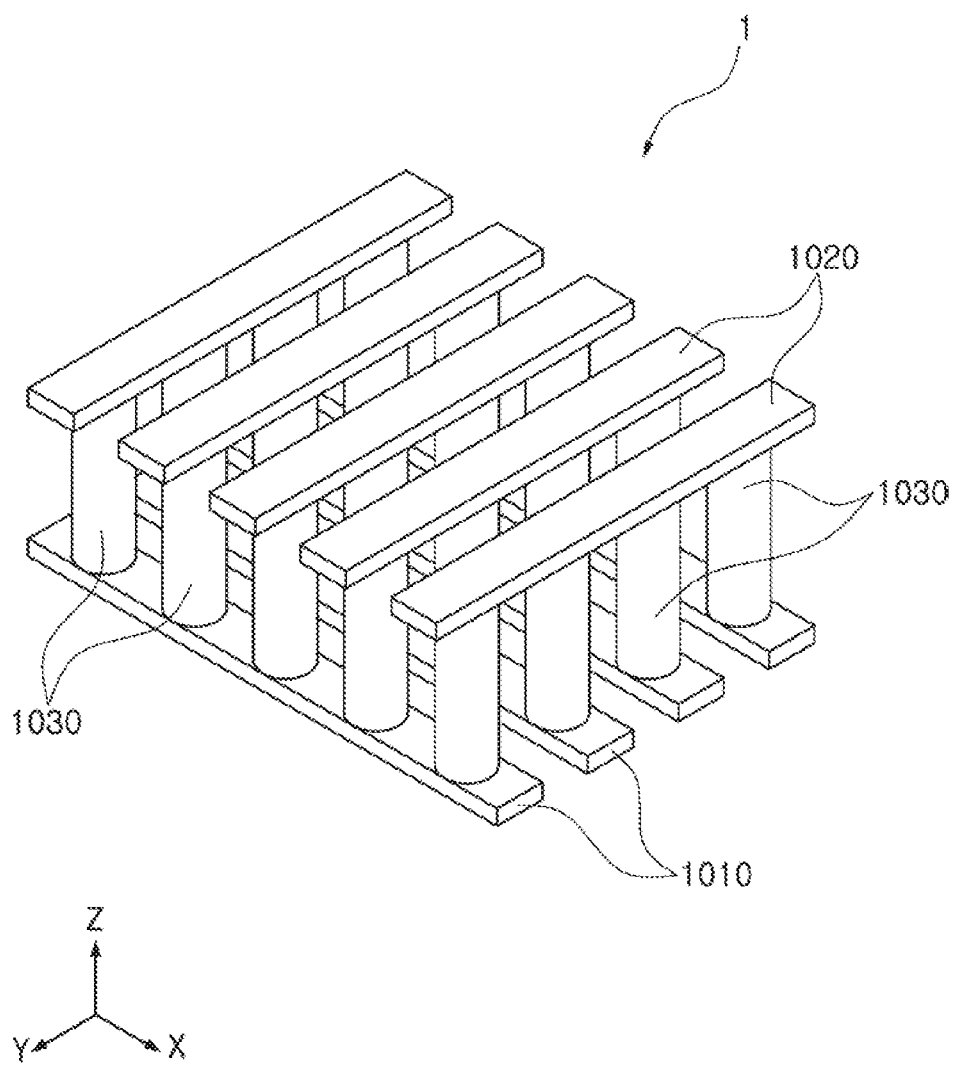
FIG. 9 is a perspective view illustrating a cross point array device according to yet another embodiment of the present disclosure.
Figure 10:
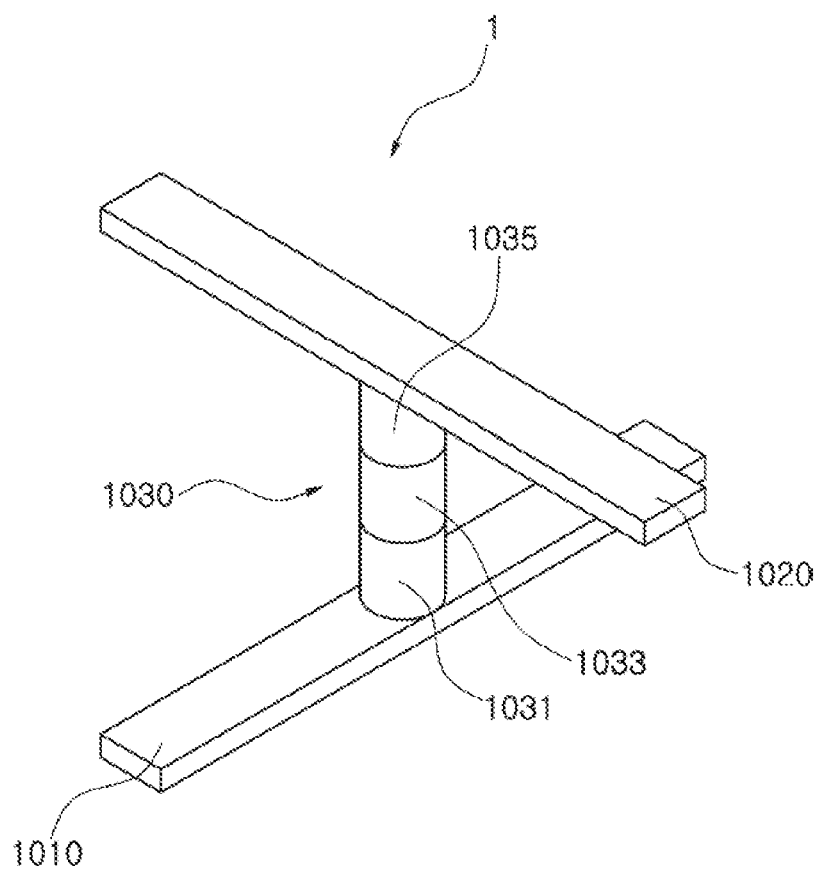
FIG. 10 is an enlarged view illustrating a portion of the cross point array device illustrated in FIG. 9.

FIG. 9 is a perspective view illustrating a cross point array device 1 according to an embodiment of the present disclosure, and FIG. 10 is an enlarged view illustrating a portion of the cross point array device 1 illustrated in FIG. 9.

Referring to FIG. 9, the cross point array device 1 may include first conductive lines 1010 arrayed in an X-axis direction, second conductive lines 1020 arrayed in a Y-axis direction, and pillar structures 1030 disposed at cross points of the first conductive lines 1010 and the second conductive lines 1020 to extend in a z-axis direction. Although a rectangular coordinate system in which the X-axis direction and the Y-axis direction are perpendicular to each other is employed as a coordinate system illustrated in FIG. 9, the present disclosure is not limited thereto. For example, in some other embodiments, various coordinate systems in which the X-axis direction and the Y-axis direction intersect each other at a non-right angle may be employed as the coordinate system used in FIG. 9. Meanwhile, the pillar structures 1030 may be two-dimensionally arrayed along the X-axis direction and the Y-axis direction. In an embodiment the first conductive lines 1010 may overlap with the second conductive lines 1020 and a pillar structure 1030 may be disposed at cross points, respectively, where the first and second electrodes overlap with one another.

Referring to FIG. 10, each of the pillar structures 1030 may include a self-rectifying layer 1031, a tunnel barrier layer 1033, and a tunneling control layer 1035. The self-rectifying layer 1031 may include an insulation material. The tunnel barrier layer 1033 may include a ferroelectric material. The tunneling control layer 1035 may include a conductive material. Conductive paths for reducing a tunneling width of electrons may be formed in the tunnel barrier layer 1033 by the tunneling control layer 1035 according to an external voltage applied between the first and second conductive lines 1010 and 1020. When another external voltage is applied between the first and second conductive lines 1010 and 1020, the conductive paths formed in tunnel barrier layer 1033 may be removed due to the presence of the tunneling control layer 1035 or the number of the conductive paths may be reduced due to the presence of the tunneling control layer 1035. The self-rectifying layer 1031 may be disposed to be in contact with the first conductive line 1010, and the tunneling control layer 1035 may be disposed to be in contact with the second conductive line 1020. The self-rectifying layer 1031, the tunnel barrier layer 1033, and the tunneling control layer 1035 may be substantially the same layers as the self-rectifying layer 150, the tunnel barrier layer 120, and the tunneling control layer 130 described with reference to FIGS. 1 to 8, respectively. Thus, detailed descriptions of the self-rectifying layer 1031, the tunnel barrier layer 1033, and the tunneling control layer 1035 will be omitted hereinafter.

The first conductive line 1010 may be formed to include at least one selected from the group consisting of a tungsten (W) layer, a titanium (Ti) layer, a copper (Cu) layer, an aluminum (Al) layer, a ruthenium (Ru) layer, a platinum (Pt) layer, an iridium (Ir) layer, a tungsten nitride (WN) layer, a titanium nitride (TiN) layer, and a tantalum nitride (TaN) layer. The first conductive line 1010 may contact the self-rectifying layer 1031 which is in contact with the tunnel barrier layer 1033 including a ferroelectric material. In such a case, an electron accumulation region or an electron depletion region may be formed to extend from an interface between the self-rectifying layer 1031 and the first conductive line 1010 into the first conductive line 1010 due to the presence of the remnant polarization in the ferroelectric material included in the tunnel barrier layer 1033.

The second conductive line 1020 may be in contact with the tunneling control layer 1035. The second conductive line 1020 may be formed to include at least one selected from the group consisting of a tungsten (W) layer, a titanium (Ti) layer, a copper (Cu) layer, an aluminum (Al) layer, a ruthenium (Ru) layer, a platinum (Pt) layer, an iridium (Ir) layer, a tungsten nitride (WN) layer, a titanium nitride (TiN) layer, and a tantalum nitride (TaN) layer.

In an embodiment, each of the pillar structures 1030 may act as a nonvolatile memory cell storing a first logic information or a second logic information using an electron accumulation region or an electron depletion region which is formed in the first conductive line 1010 according to a direction of remnant polarization existing in the tunnel barrier layer 1033 of the pillar structure 1030. In addition, the first logic information or the second logic information stored in each of the pillar structures 1030 may be read out by measuring a tunneling current flowing through the pillar structure 1030. Even after the logic information stored in the pillar structure 1030 is read out, the pillar structure 1030 may still preserve the logic information. Operations performed in the initial state, the on-state, and the off-state of the cross point array device 1 including the first conductive line 1010, the self-rectifying layer 1031, the tunnel barrier layer 1033, the tunneling control layer 1035, and the second conductive line 1020 may be substantially the same as the operations performed in the initial state, the on-state, and the off-state of the ferroelectric component 100B described with reference to FIGS. 6 to 8. Thus, descriptions of the operations performed in the initial state, the on-state, and the off-state of the cross point array device 1 will be omitted hereinafter.

In some other embodiments, each of the pillar structures 1030 may be comprised of the tunnel barrier layer 1033 and the tunneling control layer 1035 without the self-rectifying layer 1031. Thus, the tunnel barrier layer 1033 may be disposed to be in contact with the first conductive line 1010. In such a case, operations performed in the initial state, the on-state, and the off-state of the cross point array device 1 including the first conductive line 1010, the tunnel barrier layer 1033, the tunneling control layer 1035, and the second conductive line 1020 may be substantially the same as the operations performed in the initial state, the on-state, and the off-state of the ferroelectric component 100A described with reference to FIGS. 1 to 4.

Figure 11:
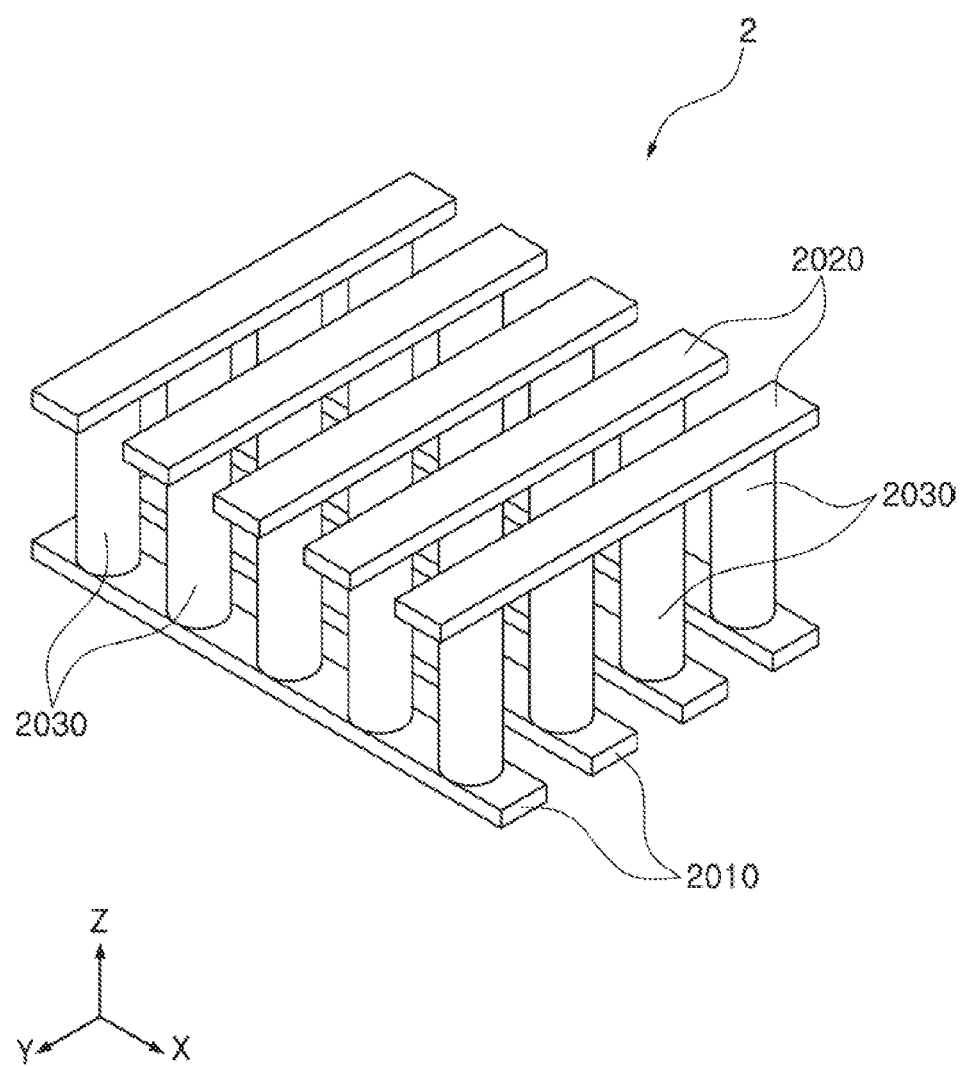
FIG. 11 is a perspective view illustrating a cross point array device according to still another embodiment of the present disclosure.
Figure 12:
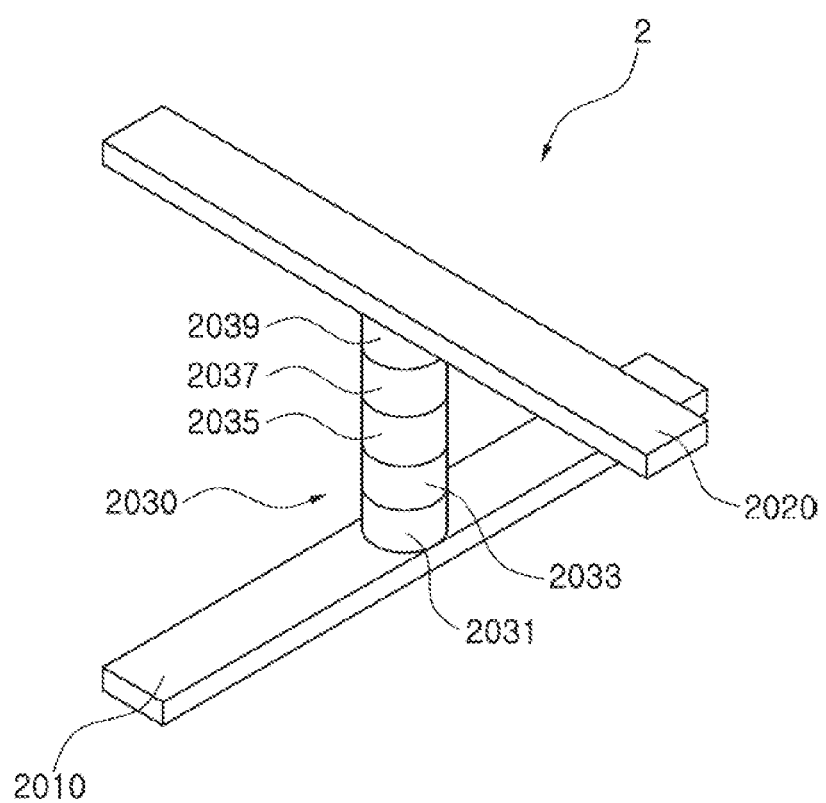
FIG. 12 is an enlarged view illustrating a portion of the cross point array device illustrated in FIG. 11.

FIG. 11 is a perspective view illustrating a cross point array device 2 according to another embodiment of the present disclosure, and FIG. 12 is an enlarged view illustrating a portion of the cross point array device 2 illustrated in FIG. 11.

Referring to FIG. 11, the cross point array device 2 may include first conductive lines 2010 arrayed in an X-axis direction, second conductive lines 2020 arrayed in a Y-axis direction, and pillar structures 2030 disposed at cross points of the first conductive lines 2010 and the second conductive lines 2020 to extend in a z-axis direction. Although a rectangular coordinate system in which the X-axis direction and the Y-axis direction are perpendicular to each other is employed as a coordinate system illustrated in FIG. 11, the present disclosure is not limited thereto. For example, in some other embodiments, various coordinate systems in which the X-axis direction and the Y-axis direction intersect each other at a non-right angle may be employed as the coordinate system used in FIG. 11, Meanwhile, the pillar structures 2030 may be two-dimensionally arrayed along the X-axis direction and the Y-axis direction. In an embodiment the first conductive lines 2010 may overlap with the second conductive lines 2020 and a pillar structure 2030 may be disposed at cross points, respectively, where the first and second electrodes overlap with one another.

Referring to FIG. 12, each of the pillar structures 2030 may include a first tunnel junction electrode 2031, a self-rectifying layer 2033, a tunnel barrier layer 2035, and a tunneling control layer 2037, and a second tunnel junction electrode 2039. The self-rectifying layer 2033 may include an insulation material. The tunnel barrier layer 2035 may include a ferroelectric material. The tunneling control layer 2037 may include a conductive material. Conductive paths for reducing a tunneling width of electrons may be formed in the tunnel barrier layer 2035 by the tunneling control layer 2037 according to an external voltage applied between the first and second conductive lines 2010 and 2020. When another external voltage is applied between the first and second conductive lines 2010 and 2020, the conductive paths formed in tunnel barrier layer 2035 may be removed due to the presence of the tunneling control layer 2037 or the number of the conductive paths may be reduced due to the presence of the tunneling control layer 1037. The self-rectifying layer 2033, the tunnel barrier layer 2035, and the tunneling control layer 2037 may be substantially the same material layers as the self-rectifying layer 150, the tunnel barrier layer 120, and the tunneling control layer 130 described with reference to FIGS. 1 to 8, respectively. Thus, descriptions about functions of the self-rectifying layer 2033, the tunnel barrier layer 2035, and the tunneling control layer 2037 will be omitted hereinafter.

The first tunnel junction electrode 2031 may be disposed between the first conductive line 2010 and the self-rectifying layer 2033. The first tunnel junction electrode 2031 may be formed to include at least one selected from the group consisting of a tungsten (W) layer, a titanium (Ti) layer, a copper (Cu) layer, an aluminum (Al) layer, a ruthenium (Ru) layer, a platinum (Pt) layer, an iridium (Ir) layer, a tungsten nitride (WN) layer, a titanium nitride (TiN) layer, and a tantalum nitride (TaN) layer. The first tunnel junction electrode 2031 may contact the self-rectifying layer 2033 which is in contact with the tunnel barrier layer 2035 including a ferroelectric material. In such a case, an electron accumulation region or an electron depletion region may be formed to extend from an interface between the self-rectifying layer 2033 and the first tunnel junction electrode 2031 into the first tunnel junction electrode 2031 due to the presence of the remnant polarization in the ferroelectric material included in the tunnel barrier layer 2035.

The second tunnel junction electrode 2039 may be disposed between the second conductive line 2020 and the tunneling control layer 2037 to be in contact with the tunneling control layer 2037. The second tunnel junction electrode 2039 may be formed to include at least one selected from the group consisting of a tungsten (W) layer, a titanium (Ti) layer, a copper (Cu) layer, an aluminum (Al) layer, a ruthenium (Ru) layer, a platinum (Pt) layer, an iridium (Ir) layer, a tungsten nitride (WN) layer, a titanium nitride (TiN) layer, and a tantalum nitride (TaN) layer.

When a predetermined voltage is applied between the first tunnel junction electrode 2031 and the second tunnel junction electrode 2039 such that a relatively positive bias is applied to the second tunnel junction electrode 2039, the tunneling control layer 2037 may supply metal ions into the tunnel barrier layer 2035. In such a case, the metal ions in the tunnel barrier layer 2035 may be combined with electrons emitted from the first tunnel junction electrode 2031 to form conductive filaments in the tunnel barrier layer 2035. The conductive filaments may be formed to extend from the interface between the tunneling control layer 2037 and the tunnel barrier layer 2035 into the tunnel barrier layer 2035. In such a case, the conductive filaments may be formed not to reach the self-rectifying layer 2033. In contrast, when another predetermined voltage is applied between the first tunnel junction electrode 2031 and the second tunnel junction electrode 2039 such that a relatively negative bias is applied to the second tunnel junction electrode 2039, the conductive filaments in the tunnel barrier layer 2035 may be removed or the number of the conductive filaments in the tunnel barrier layer 2035 may be reduced.

In an embodiment, each of the pillar structures 2030 may act as a nonvolatile memory cell storing a first logic information or a second logic information using an electron accumulation region or an electron depletion region which is formed in the first tunnel junction electrode 2031 according to a direction of remnant polarization existing in the tunnel barrier layer 2035 of the pillar structure 2030. In addition, the first logic information or the second logic information stored in each of the pillar structures 2030 may be read out by measuring a tunneling current flowing through the pillar structure 2030. Even after the logic information stored in the pillar structure 2030 is read out, the pillar structure 2030 may still preserve the logic information. Operations performed in the initial state, the on-state, and the off-state of the cross point array device 2 including the first tunnel junction electrode 2031, the self-rectifying layer 2033, the tunnel barrier layer 2035, the tunneling control layer 2037, and the second tunnel junction electrode 2039 may be substantially the same as the operations performed in the initial state, the on-state, and the off-state of the ferroelectric component 1008 described with reference to FIGS. 6 to 8. Thus, descriptions of the operations performed in the initial state, the on-state, and the off-state of the cross point array device 2 will be omitted hereinafter.

In some other embodiments, each of the pillar structures 2030 may be comprised of the first tunnel junction electrode 2031, the tunnel barrier layer 2035, the tunneling control layer 2037, and the second tunnel junction electrode 2039 without the self-rectifying layer 2033. Thus, the tunnel barrier layer 2035 may be disposed to be in contact with the first tunnel junction electrode 2031. In such a case, operations performed in the initial state, the on-state, and the off-state of the cross point array device 2 including the first tunnel junction electrode 2031, the tunnel barrier layer 2035, the tunneling control layer 2037, and the second tunnel junction electrode 2039 may be substantially the same as the operations performed in the initial state, the on-state, and the off-state of the ferroelectric component 100A described with reference to FIGS. 1 to 4.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:
1. A ferroelectric component comprising:
a first electrode;
a tunnel barrier layer disposed on the first electrode to include a ferroelectric material;
a tunneling control layer disposed on the tunnel barrier layer to control a tunneling width of electric charges passing through the tunnel barrier layer; and
a second electrode disposed on the tunneling control layer,
wherein the tunneling control layer is configured to form conductive paths of electrons to reduce the tunneling width in the tunnel barrier layer, or is configured to reduce a number of the conductive paths of the electrons to increase the tunneling width formed in the tunnel barrier layer, according to an external voltage applied between the first electrode and the second electrode,
wherein the tunnel barrier layer has remnant polarizations with different polarization directions of the ferroelectric material,
wherein the conductive filaments extend from an interface between the tunneling control layer and the tunnel barrier layer into the tunnel barrier layer; and
wherein the conductive filaments do not contact the first electrode.

2. The ferroelectric component of claim 1,
wherein the ferroelectric material includes at least one of HfO2, ZrO2, Hf0.5Zr0.5O2, PbZrxTi1-xO3(0<x<1), Ba(Sr,Ti)O3, BaTiO3, Bi4-xLaxTi3O12(0<x<1), SrBi2Ta2O9, BiFeO3, Pb5Ge5O11, SrBi2Nb2O9, and YMnO3 or at least one of a doped hafnium oxide material, a doped zirconium oxide material, and a doped hafnium zirconium oxide material; and
wherein when the ferroelectric material includes at least one of the doped hafnium oxide material, the doped zirconium oxide material, and the doped hafnium zirconium oxide material, at least one of carbon, silicon, magnesium, aluminum, yttrium, nitrogen, germanium, tin, strontium, lead, calcium, barium, titanium, gadolinium, and lanthanum is used as a dopant.

3. The ferroelectric component of claim 1,
wherein the first electrode is in contact with the tunnel barrier layer; and
wherein the first electrode is configured to have an electron accumulation region or an electron depletion region which is formed according to directions of remnant polarizations of the ferroelectric material included in the tunnel barrier layer.

4. The ferroelectric component of claim 1,
wherein each of the first and second electrodes includes at least one of a tungsten (W) layer, a titanium (Ti) layer, a copper (Cu) layer, an aluminum (Al) layer, a ruthenium (Ru) layer, a platinum (Pt) layer, an iridium (Ir) layer, a tungsten nitride (WN) layer, a titanium nitride (TiN) layer, and a tantalum nitride (TaN) layer.

5. The ferroelectric component of claim 1,
wherein the ferroelectric component is configured to nonvolatilely store one of two different logic data according to directions of the remnant polarizations of the ferroelectric material included in the tunnel barrier layer.

6. The ferroelectric component of claim 1, further comprising a self-rectifying layer disposed between the first electrode and the tunnel barrier layer,
wherein the self-rectifying layer includes an insulation material.

7. The ferroelectric component of claim 1,
wherein the tunneling control layer includes at least one of a silver (Ag) material and a copper (Cu) material.

8. The ferroelectric component of claim 1,
wherein when a first predetermined voltage is applied between the first electrode and the second electrode such that a relatively positive bias is applied to the second electrode, the tunneling control layer is configured to supply metal ions into the tunnel barrier layer and the metal ions in the tunnel barrier layer are combined with electrons emitted from the first electrode to form conductive filaments in the tunnel barrier layer.

9. The ferroelectric component of claim 8,
wherein when a second predetermined voltage is applied between the first electrode and the second electrode such that a relatively negative bias is applied to the second electrode, the conductive filaments in the tunnel barrier layer are removed.

10. A cross point array device comprising:
a first conductive line;
a second conductive line overlapping the first conductive line; and
a pillar structure disposed at a cross point of the first and second electrodes, the pillar structure including a self-rectifying layer, a tunnel barrier layer, and a tunneling control layer,
wherein the self-rectifying layer includes an insulation material,
wherein the tunnel barrier layer includes a ferroelectric material,
wherein the tunneling control layer includes a conductive material, and
wherein the tunneling control layer is configured to form conductive paths of electrons to reduce a tunneling width in the tunnel barrier layer, or is configured to reduce a number of the conductive paths of the electrons to increase the tunneling width formed in the tunnel barrier layer, according to an external voltage applied between the first conductive line and the second conductive line,
wherein the tunnel barrier layer has remnant polarizations with different polarization directions of the ferroelectric material,
wherein the conductive filaments extend from an interface between the tunneling control layer and the tunnel barrier layer into the tunnel barrier layer, and
wherein the conductive filaments do not contact the self-rectifying layer.

11. The cross point array device of claim 10,
wherein the ferroelectric material includes at least one of HfO2, ZrO2, Hf0.5Zr0.5O2, PbZrxTi1-xO3(0<x<1), Ba(Sr,Ti)O3, BaTiO3, Bi4-xLaxTi3O12(0<x<1), SrBi2Ta2O9, BiFeO3, Pb5Ge5O11, SrBi2Nb2O9, and YMnO3 or at least one of a doped hafnium oxide material, a doped zirconium oxide material, and a doped hafnium zirconium oxide material; and
wherein when the ferroelectric material includes at least one of the doped hafnium oxide material, the doped zirconium oxide material, and the doped hafnium zirconium oxide material, at least one of carbon, silicon, magnesium, aluminum, yttrium, nitrogen, germanium, tin, strontium, lead, calcium, barium, titanium, gadolinium, and lanthanum is used as a dopant.

12. The cross point array device of claim 10,
wherein the first conductive line is in contact with the self-rectifying layer; and
wherein the first conductive line is configured to have an electron accumulation region or an electron depletion region which is formed according to directions of the remnant polarizations of the ferroelectric material included in the tunnel barrier layer.

13. The cross point array device of claim 10,
wherein the tunneling control layer includes at least one of a silver (Ag) material and a copper (Cu) material.

14. The cross point array device of claim 10, further comprising:
a first tunnel junction electrode disposed between the first conductive line and the self-rectifying layer; and
a second tunnel junction electrode disposed between the second conductive line and the tunneling control layer.

15. The cross point array device of claim 14,
wherein the first tunnel junction electrode and the self-rectifying layer are in contact with each other; and
wherein the first tunnel junction electrode is configured to have an electron accumulation region or an electron depletion region which is formed according to directions of the remnant polarizations of the ferroelectric material included in the tunnel barrier layer.

16. The cross point array device of claim 14, wherein each of the first and second tunnel junction electrodes includes at least one of a tungsten (W) layer, a titanium (Ti) layer, a copper (Cu) layer, an aluminum (Al) layer, a ruthenium (Ru) layer, a platinum (Pt) layer, an iridium (Ir) layer, a tungsten nitride (WN) layer, a titanium nitride (TiN) layer, and a tantalum nitride (TaN) layer.

17. The cross point array device of claim 14, wherein when a first predetermined voltage is applied between the first tunnel junction electrode and the second tunnel junction electrode such that a relatively positive bias is applied to the second tunnel junction electrode, the tunneling control layer is configured to supply metal ions into the tunnel barrier layer and the metal ions in the tunnel barrier layer are combined with electrons emitted from the first tunnel junction electrode to form conductive filaments in the tunnel barrier layer.

18. The cross point array device of claim 17, wherein when a second predetermined voltage is applied between the first tunnel junction electrode and the second tunnel junction electrode such that a relatively negative bias is applied to the second tunnel junction electrode, the conductive filaments in the tunnel barrier layer are removed.

* * * * *